United States Patent
Haji et al.

(10) Patent No.: US 7,409,761 B2
(45) Date of Patent: Aug. 12, 2008

(54) ELECTRONIC COMPONENT MOUNTING APPARATUS AND METHOD OF MOUNTING ELECTRONIC COMPONENTS

(75) Inventors: Hiroshi Haji, Fukuoka (JP); Mitsuru Ozono, Fukuoka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 377 days.

(21) Appl. No.: 10/571,289

(22) PCT Filed: Apr. 8, 2005

(86) PCT No.: PCT/JP2005/007276

§ 371 (c)(1), (2), (4) Date: Mar. 9, 2006

(87) PCT Pub. No.: WO2005/101943

PCT Pub. Date: Oct. 27, 2005

(65) Prior Publication Data

US 2008/0104831 A1    May 8, 2008

(30) Foreign Application Priority Data

Apr. 15, 2004  (JP) .............................. 2004-120166

(51) Int. Cl.
*H05K 3/30*    (2006.01)
*B23P 19/00*    (2006.01)

(52) U.S. Cl. .............................. 29/832; 29/739; 29/740; 29/833; 29/840

(58) Field of Classification Search .................... 29/739, 29/740, 755, 832, 833
See application file for complete search history.

(56) References Cited

U.S. PATENT DOCUMENTS

| 5,172,469 | A | 12/1992 | Onda et al. | |
| 6,606,790 | B2 * | 8/2003 | Hidese | 29/832 |
| 6,865,803 | B2 * | 3/2005 | Hidese | 29/832 |
| 7,017,261 | B2 * | 3/2006 | Okamoto et al. | 29/832 |
| 7,356,918 | B2 * | 4/2008 | Okuda et al. | 29/833 |
| 2002/0053134 | A1 * | 5/2002 | Hidese | 29/700 |

FOREIGN PATENT DOCUMENTS

| EP | 0 487 315 A2 | 5/1992 |
| JP | 11-121508 | 4/1999 |
| JP | 11-135563 | 5/1999 |
| JP | 2001-185563 | 7/2001 |
| JP | 2003-188194 | 7/2003 |
| KR | 20-0213106 | 2/2001 |

* cited by examiner

*Primary Examiner*—C. J Arbes
(74) *Attorney, Agent, or Firm*—McDermott Will & Emery LLP (57) ABSTRACT

In an electronic component mounting process for mounting electronic components (6) to a substrate, each of the electronic components having an adhesive layer on a surface to be bonded to the substrate is picked up with suction nozzle provided with individual heater, and a time taken for the mounting operation is so allotted that a first heating time of a duration from a moment when the suction nozzle comes into contact with the electronic component for picking it up till another moment immediately before it begins a mounting motion to the substrate is longer than a second heating time of a duration from the moment when the suction nozzle begins the mounting motion till another moment when it leaves the electronic component mounted to the substrate.

10 Claims, 9 Drawing Sheets

ELECTRONIC COMPONENT MOUNTING APPARATUS AND METHOD OF MOUNTING ELECTRONIC COMPONENTS

This application is the U.S. National Phase under 35 U.S.C. § 371 of International Application No. PCT/JP2005/007276, filed Apr. 8, 2005, which in turn claims the benefit of Japanese Application No. 2004-120166, filed Apr. 15, 2004, the disclosures of which Applications are incorporated by reference herein in their entirety.

TECHNICAL FIELD

The present invention relates to an electronic component mounting apparatus for mounting an electronic component having an adhesive layer on a surface to be bonded to a substrate defining a mounting object. The invention also relates to a method of mounting the electronic component.

BACKGROUND ART

In the process of manufacturing semiconductor devices, semiconductor elements split into individual segments from a semiconductor wafer are mounted with adhesive to a substrate such as a lead frame. The step for mounting semiconductor elements to a substrate adopted hitherto is a method in which the semiconductor elements are mounted on an adhesive material coated beforehand on the substrate. It has become difficult, however, to use the conventional method as it is, because of the advance of low-profiling of semiconductor elements in recent years.

In other words, there requires a thin layer of adhesive formed uniformly between the substrate and the semiconductor elements in order to bond the semiconductor elements properly to the substrate. When mounting thin semiconductor elements upon a surface of adhesive, however, it is difficult to press and spread the pre-coated adhesive by using rigidness of the semiconductor elements themselves since they are very flexible and low in rigidity. In addition, the adhesive tends to flow upward to upper surfaces of the semiconductor elements and stick to the mounting tool when the thin semiconductor elements are pressed upon the adhesive, thereby giving rise to a problem of impeding the normal function of the mounting tool to hold the elements.

For the above reason, there has been a tendency in recent years to adopt the method of forming an adhesive layer on semiconductor element's own surface in advance by bonding a die-attach film made of semi-cured adhesive resin in a filmily form to a semiconductor wafer before it is split into individual segments of semiconductor elements, as is disclosed, for instance, in Japanese Patent Unexamined Publication, No. 2001-185563. This technique can help reinforce the thin and flexuous semiconductor elements with the resin layer for ease of handling, and avoid drawbacks such as the adhesive flowing upward during mounting of the semiconductor elements to a substrate.

Furthermore, it requires a pressure for pressing the electronic components against the substrate and a heat for hardening the adhesive layer when securing such components as the semiconductor elements to the substrate with the adhesive layer, as disclosed in Japanese Patent Unexamined Publications, Nos. H11-135563 and H11-121508, for examples. An electronic component mounting apparatus used for the purpose of mounting semiconductor elements to the substrate is therefore equipped with a thermo-compression bonding mechanism to heat and press the semiconductor elements.

In any of the techniques illustrated in the above-referred documents for mounting semiconductor elements, however, there was a need for the semiconductor elements to be held in a state of being depressed against the substrate with a thermo-compressing tool for a predetermined duration in the process of thermo-compression bonding. This duration of holding time was not easily reducible by a large margin since it usually required a time of the order of seconds to harden the adhesive resin to a certain degree. It was thus a main factor of the difficulty in shortening the time for the mounting work, and the impediment against improving productivity of the mounting process in manufacturing the semiconductor devices.

SUMMARY OF THE INVENTION

An electronic component mounting apparatus of the present invention is an apparatus for mounting electronic components to a substrate while heating the electronic components, each having an adhesive layer on a surface to be bonded to the substrate, and it comprises an electronic component feeder for feeding the electronic components, a substrate retainer for retaining the substrate, a mounting head provided with a plurality of holding tools for individually holding the electronic components and electronic component heating devices for heating the plurality of electronic components held by these holding tools, a mounting mechanism for transferring the mounting head from the electronic component feeder to the substrate retainer and for mounting the plurality of electronic components to the substrate by using the plurality of holding tools, and a controller for controlling the mounting mechanism.

The electronic component heating devices disclosed here heat the electronic components from a moment when the holding tools pick up the electronic components at the electronic component feeder until another moment when the holding tools release the electronic components after mounting them to the substrate. The controller controls the mounting mechanism in a manner so that a first heating time of a duration from the moment when the holding tool comes into contact with the electronic component for picking it up till another moment immediately before the holding tool begins a mounting motion to the substrate is longer than a second heating time of a duration from the moment when the holding tool begins the mounting motion till another moment when the holding tool leaves the electronic component mounted to the substrate.

According to this structure, the electronic component mounting apparatus of the present invention can improve efficiency of the electronic component mounting operation and realize a high productivity in the mounting step.

A method of mounting electronic components of the present invention is a technique for mounting electronic components having an adhesive layer on surfaces to be bonded to a substrate while heating them, and it comprises an electronic component holding step for repeating a pick-up motion to pick up the electronic components supplied by an electronic component feeder one after another in a successive manner with each of a plurality of holding tools provided on a mounting head, a mounting head transferring step for moving the mounting head, after the electronic component holding step, to a position above a substrate retainer retaining the substrate, an electronic component mounting step for repeating a mounting operation, after the mounting head transferring step, to mount the electronic components to the substrate by vertically shifting the plurality of holding tools one after another in a successive manner, an electronic component heating step for heating the electronic components from a moment when the holding tools come into contact with and pick up the electronic components at the electronic component feeder until another moment when the holding tools release and leave the electronic components after mounting them to the substrate retained on the substrate retainer.

The electronic component heating step here comprises a first heating time of a duration from a moment when the holding tool comes into contact with the electronic component for picking it up till another moment immediately before the holding tool begins a mounting motion to the substrate, and a second heating time of a duration from the moment when the holding tool begins the mounting motion till another moment when the holding tool leaves the electronic component mounted to the substrate, and that the first heating time is set longer than the second heating time.

According to this method of mounting electronic components of the invention, the electronic component mounting step for holding and mounting the electronic components to the substrate one after another on a successive manner with the plurality of holding tools and the electronic component heating step for heating the electronic components by the holding tools are carried out simultaneously, and that the first heating time in the electronic component heating step of the duration from the moment when the holding tool comes into contact with the electronic component for picking it up until another moment immediately before the holding tool begins the mounting motion to the substrate is set longer than the second heating time of the duration from the moment when the holding tool begins the mounting motion till another moment when the holding tool leaves the electronic component mounted to the substrate. This method can reduce substantially the time to heat the electronic components while pressing them to the substrate, thereby improving efficiency of the electronic component mounting operation and realizing the high productivity in the mounting step.

DETAILED DESCRIPTION OF THE PREFERRED EMBODIMENTS

Description is provided hereinafter of the preferred embodiments of the present invention with reference to the accompanying drawings.

First Exemplary Embodiment

Figure 1:
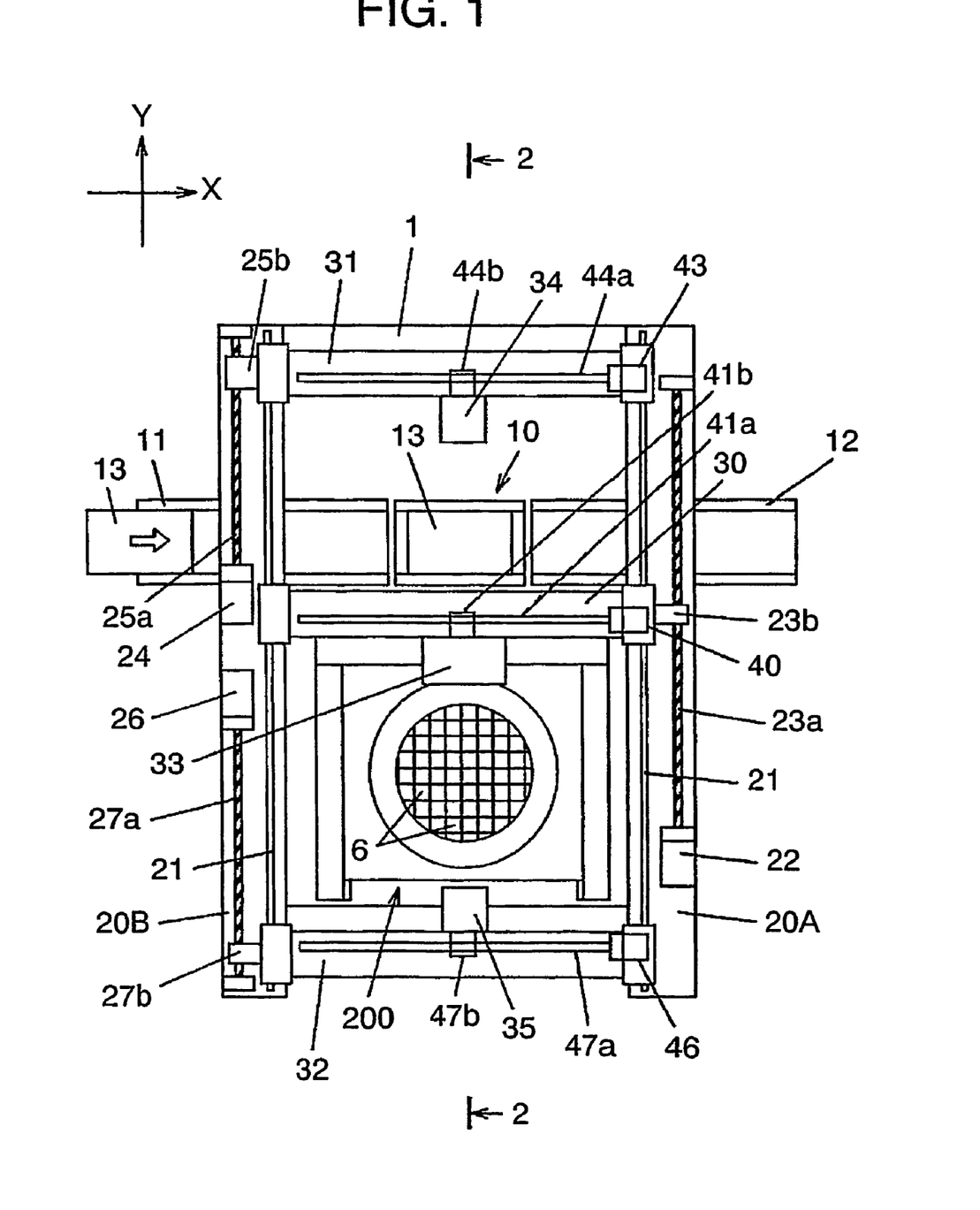
FIG. 1 is a plan view of an electronic component mounting apparatus according to a first exemplary embodiment of the present invention.
Figure 2:
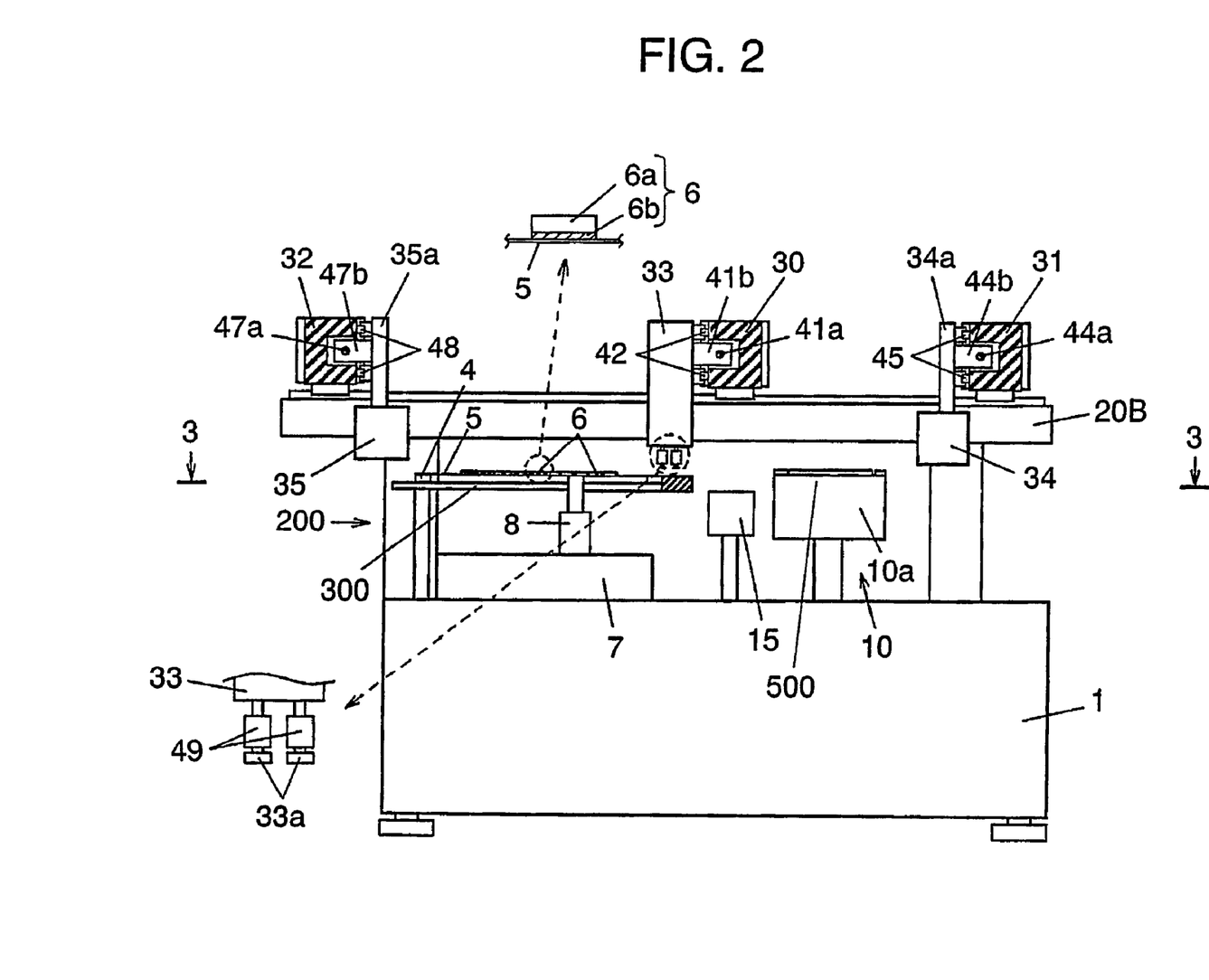
FIG. 2 is a sectioned side view of the electronic component mounting apparatus of the same exemplary embodiment of the present invention.
Figure 3:
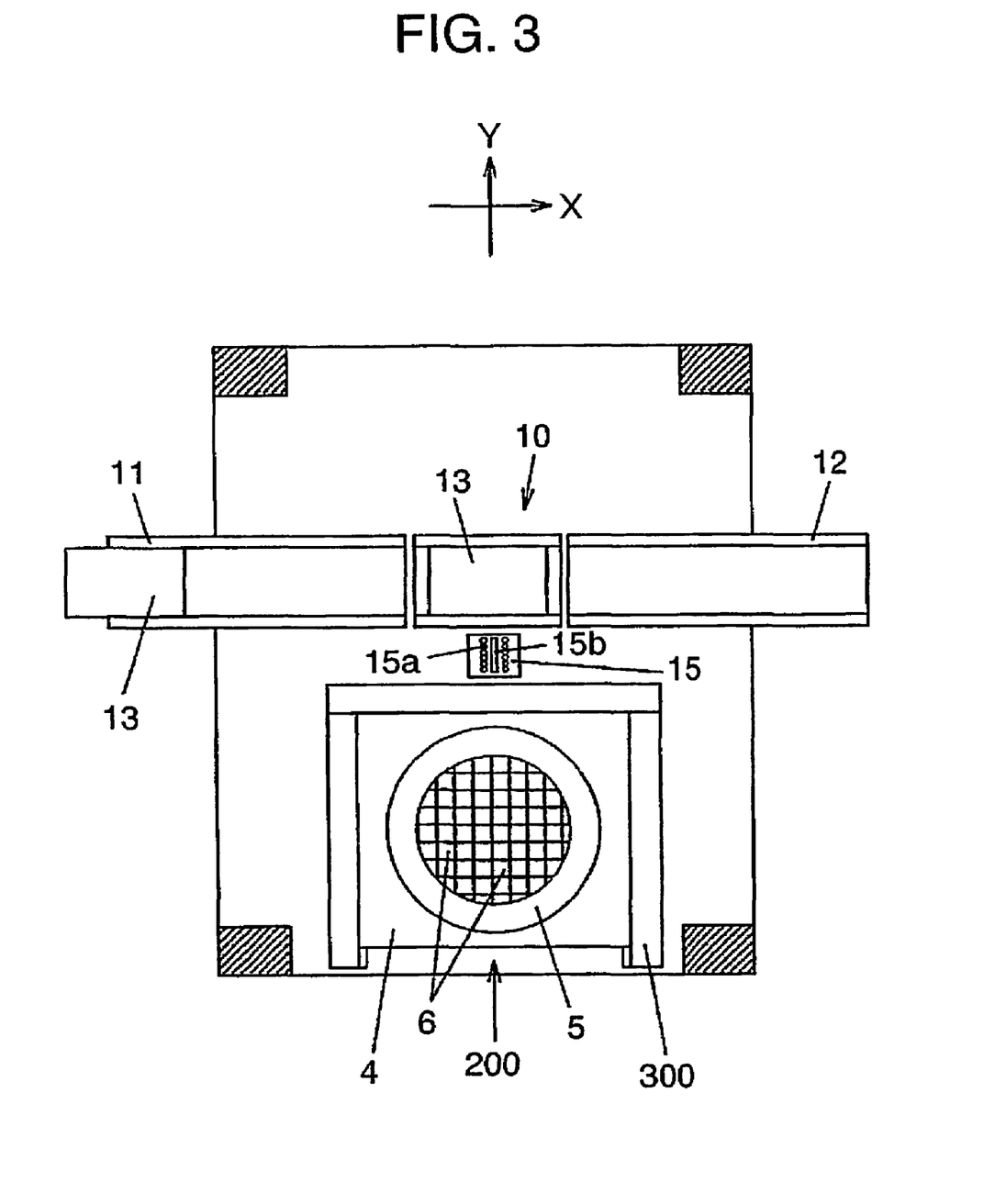
FIG. 3 is a sectioned plan view of the electronic component mounting apparatus of the same exemplary embodiment of the present invention.
Figure 4:
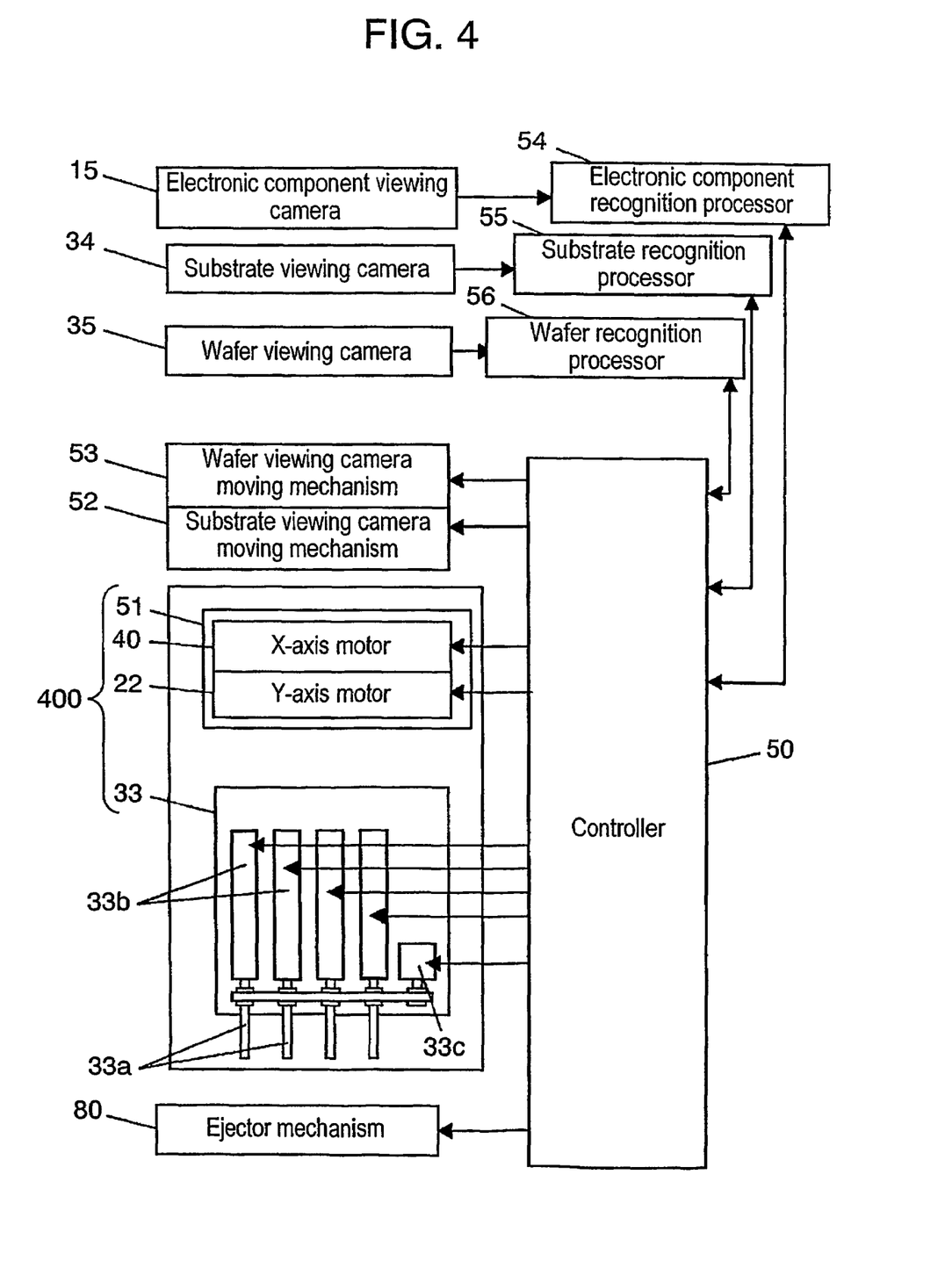
FIG. 4 is a block diagram showing a configuration of a control system of the electronic component mounting apparatus of the same exemplary embodiment of this invention.
Figure 5:
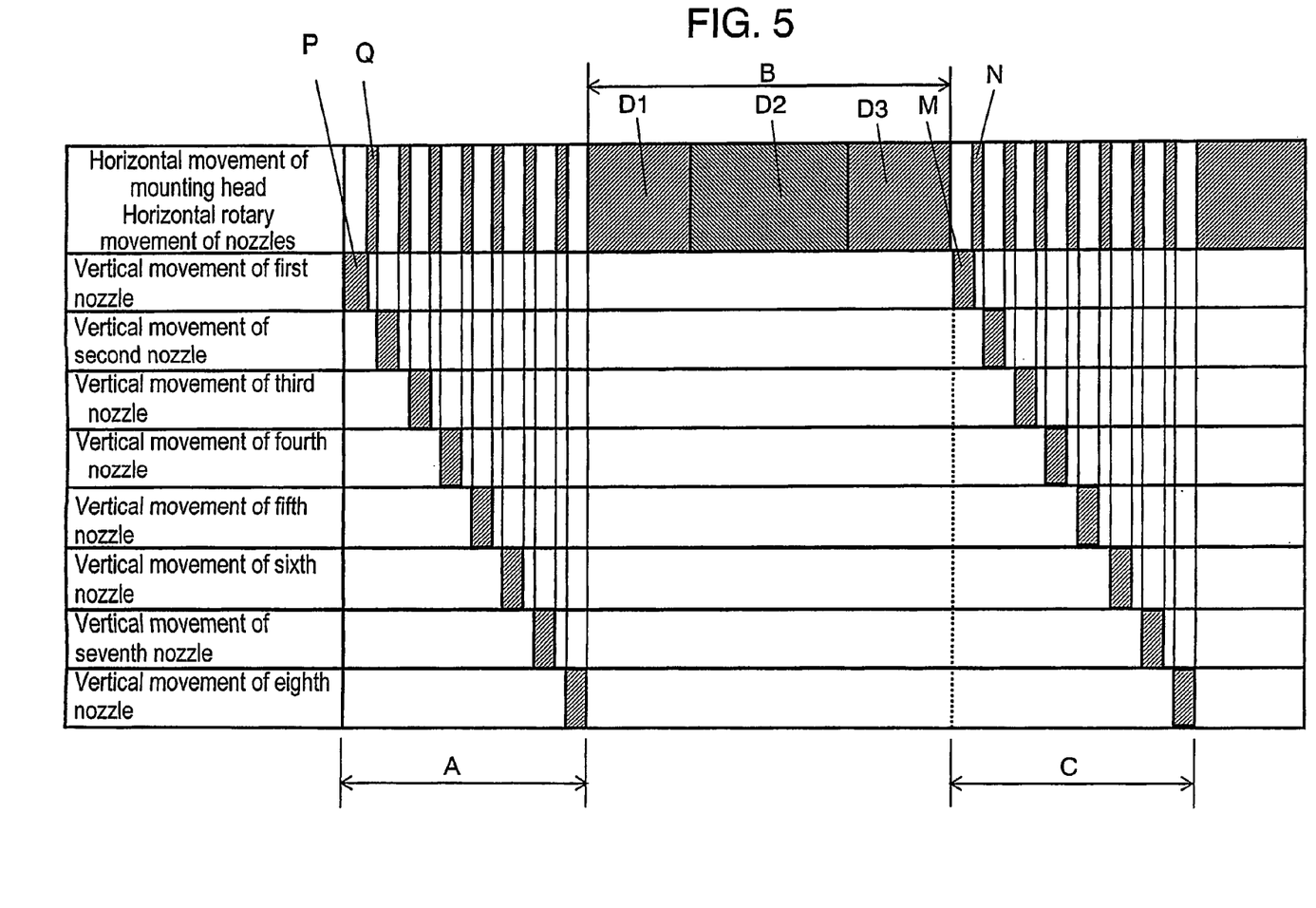
FIG. 5 is a timing chart showing a mounting operation of the electronic component mounting apparatus of the same exemplary embodiment of this invention.
Figure 6A:
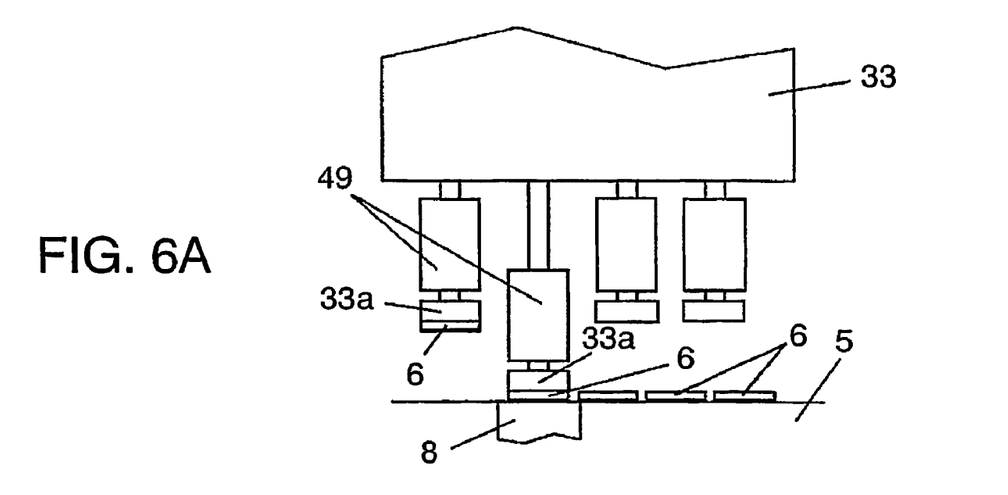
FIG. 6A, FIG. 6B and FIG. 6C are diagrammatic drawings explanatorily illustrating a component transferring and mounting operation of the electronic component mounting apparatus of the same exemplary embodiment of this invention.
Figure 6B:
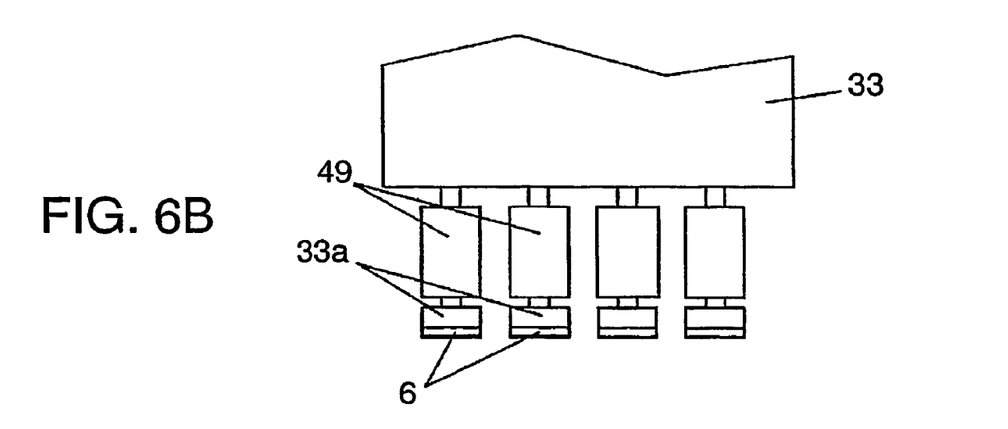
Figure 6C:
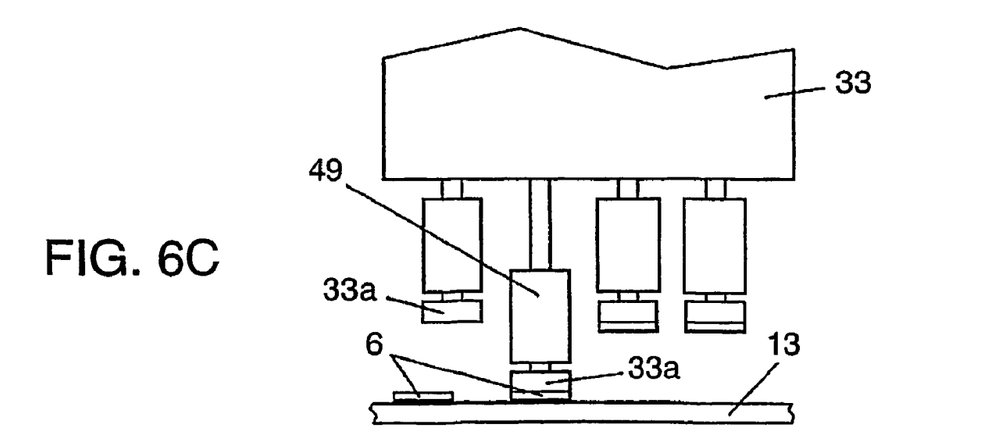
Figure 7:
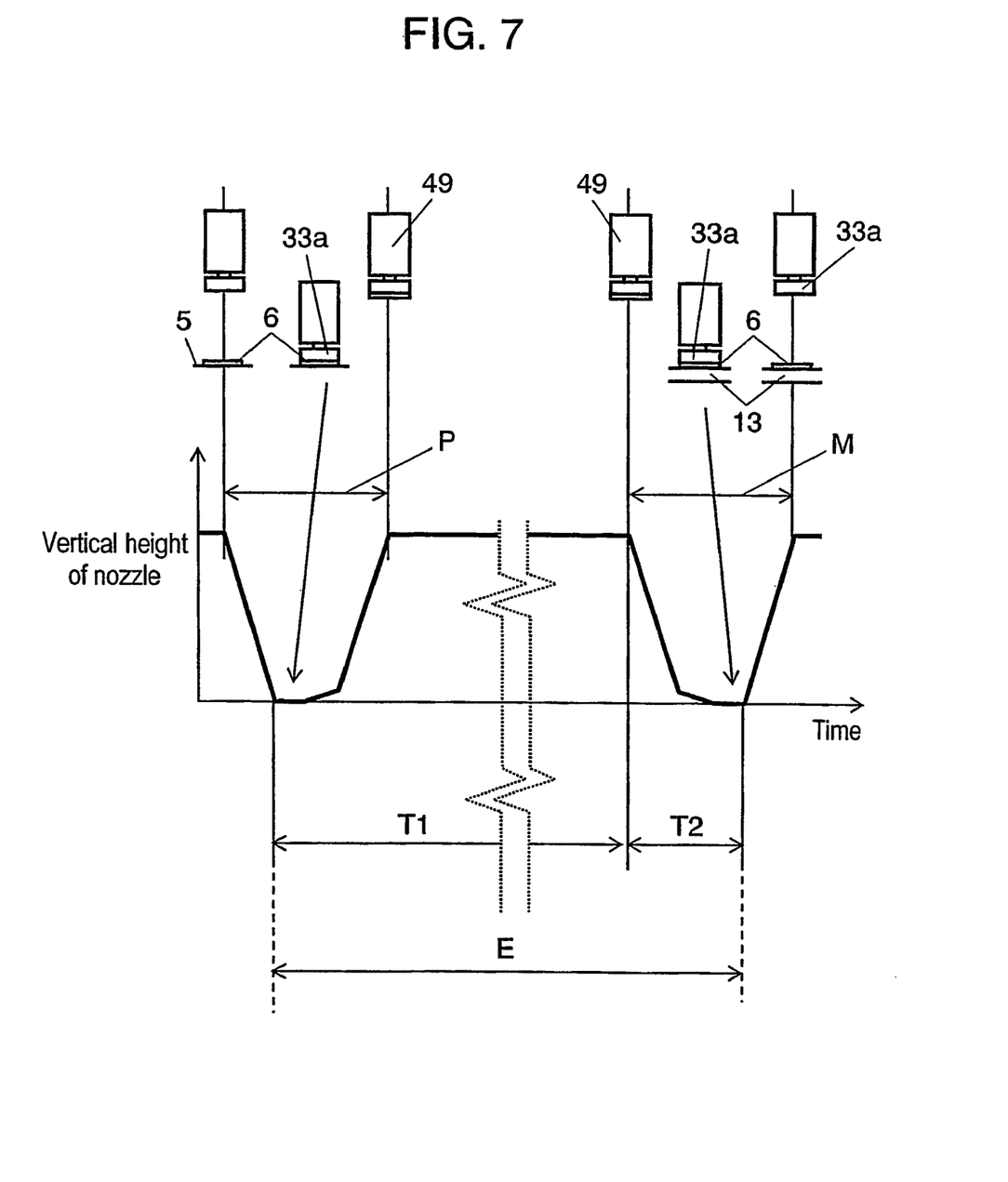
FIG. 7 is another diagrammatic drawing illustrating explanatorily the component transferring and mounting operation of the electronic component mounting apparatus of the same exemplary embodiment of this invention.
Figure 8:
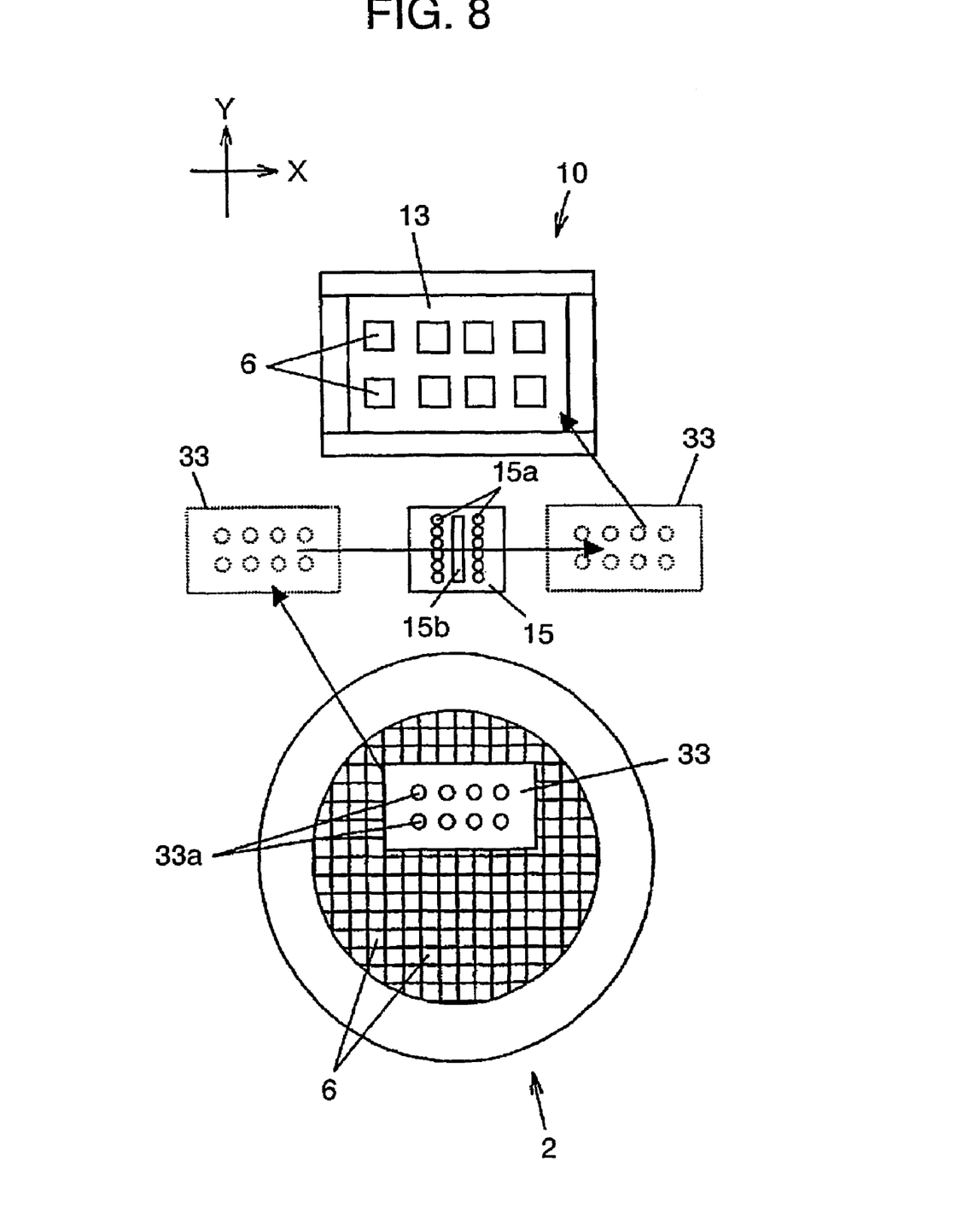
FIG. 8 is still another diagrammatic drawing illustrating explanatorily the component transferring and mounting operation of the electronic component mounting apparatus of the same exemplary embodiment of this invention.

FIG. 1 is a plan view of an electronic component mounting apparatus according to the first exemplary embodiment of this invention, FIG. 2 a sectioned side view of the electronic component mounting apparatus of this same exemplary embodiment, FIG. 3 a sectioned plan view of the electronic component mounting apparatus of the same exemplary embodiment, FIG. 4 a block diagram showing a configuration of a control system of the electronic component mounting apparatus of the same exemplary embodiment, FIG. 5 a timing chart showing a mounting operation of the electronic component mounting apparatus of the same exemplary embodiment, FIGS. 6A, 6B and 6C diagrammatic drawings explanatorily illustrating a component transferring and mounting operation of the electronic component mounting apparatus of the same exemplary embodiment, FIG. 7 another diagrammatic drawing explanatorily illustrating the component transferring and mounting operation of the electronic component mounting apparatus of the same exemplary embodiment, and FIG. 8 still another diagrammatic drawing explanatorily illustrating the component transferring and mounting operation of the electronic component mounting apparatus of the same exemplary embodiment.

Referring to FIG. 1, FIG. 2 and FIG. 3, description is provided first of an overall structure of the electronic component mounting apparatus. FIG. 2 and FIG. 3 depict a sectional view taken along a line 2-2 in FIG. 1 and another sectional view taken along a line 3-3 in FIG. 2 respectively.

In FIG. 1, electronic component feeder 200 is disposed to base 1. Electronic component feeder 200 is provided with jig holder 300, as shown in FIG. 2 and FIG. 3. Jig holder 300 detachably holds jig 4 having adhesive sheet 5 disposed to it. A large number of electronic components 6 split into individual segments are adhesively secured to adhesive sheet 5. Electronic component feeder 200 supplies electronic components 6 in the state of being adhered flatwise in rows on adhesive sheet 5 when jig 4 is held in position on jig holder 300.

As shown in FIG. 2, ejector 8 is disposed under adhesive sheet 5 held on jig holder 300 in a horizontally movable manner by ejector X-Y table 7. Ejector 8 has pin elevating mechanism to raise and lower an ejector pin (not shown in the figures) for the purpose of pushing up the component chips. The ejector pin pushes up electronic component 6 from the underneath of adhesive sheet 5 to remove electronic component 6 from adhesive sheet 5 when electronic component 6 is picked up from adhesive sheet 5 with a mounting head, as will be described later. Ejector 8 functions as an adhesive sheet separating mechanism for removing electronic component 6 from adhesive sheet 5.

Each of electronic components 6 here has adhesive layer 6b formed on the lower surface of semiconductor chip 6a, or the surface to be bonded to substrate 13, as shown in an enlarged part of the drawing. Adhesive layer 6b comprises a semi-hardened adhesive resin, and it is formed by bonding a die-attach film made of the semi-cured resin in a filmily form on a semiconductor wafer before being split into the individual segments of semiconductor chips 6a. When mounting electronic component 6 to substrate 13, it is bonded by heating adhesive layer 6b while pressing it against substrate 13. Accordingly, the electronic component mounting apparatus discussed in this exemplary embodiment mounts electronic component 6 to substrate 13 while heating adhesive layer 6b provided on the surface to be bonded to substrate 13.

As shown in FIG. 3, substrate retainer 10 is disposed to an upper surface of base 1 in a position apart from electronic component feeder 200 along the Y-direction, for retaining substrate 13 on which electronic components 6 are mounted. There are substrate carry-in conveyer 11 and substrate carry-out conveyer 12 arranged in the upstream and downstream respectively of substrate retainer 10 along the X-direction. Substrate 13 carried in from the upstream by substrate carry-in conveyer 11 is transferred to substrate retainer 10 where electronic components are mounted to it, and carried out to the downstream by substrate carry-out conveyer 12.

Substrate retainer 10 is provided with substrate holder 10a having a built-in substrate heater 500 for heating the substrate, as shown in FIG. 2. Substrate 13 carried in and held by substrate retainer 10 is heated from the underside by heater 500. In other words, substrate retainer 10 has a structure equipped with heater 500 for heating substrate, so that it can preheat substrate 13 prior to mounting the electronic components in order to expedite thermal curing of adhesive layer 6b.

In FIG. 1, first Y-axis base 20A and second Y-axis base 20B are disposed in a longitudinal orientation to the upper surface of base 1 at both sides thereof along the Y-direction orthogonal to the direction where the substrate is transferred (i.e., the X-direction). First Y-axis base 20A and second Y-axis base 20B have their respective one of Y-axis guides 21 disposed to their upper surfaces in a manner to extend substantially entirely over their dimension along the longitudinal direction (i.e., the Y-direction). The pair of Y-axis guides 21 are thus in parallel to each other with electronic component feeder 200 and substrate retainer 10 positioned between them.

The pair of Y-axis guides 21 supports three beam members, namely, first beam member 31, center beam member 30 and second beam member 32, at both ends thereof in a manner so that they are freely slidable in the Y-direction. Center beam member 30 is provided with nut member 23b protruding from the right end thereof. Feed screw 23a engaged with nut member 23b is driven by Y-axis motor 22 disposed horizontally to first Y-axis base 20A. When driven by Y-axis motor 22, center beam member 30 moves horizontally in the Y-direction along Y-axis guides 21.

Both first beam member 31 and the second beam member 32 are also provided with nut members 25b and 27b respectively in a protruding manner from their left ends. Feed screws 25a and 27a engaged with their respective nut members 25b and 27b are driven by Y-axis motors 24 and 26 disposed horizontally to second Y-axis base 20B. When driven by Y-axis motors 24 and 26, first beam member 31 and second beam member 32 also move horizontally in the Y-direction along Y-axis guides 21.

Center beam member 30 is equipped with mounting head 33. Nut member 41b fixed to mounting head 33 is in engagement with feed screw 41a which is driven by X-axis motor 40. When driven by X-axis motor 40, mounting head 33 moves in the X-direction by being guided along X-axis guides 42 refer to FIG. 2) provided on one side of center beam member 30.

Mounting head 33 is provided with a plurality of suction nozzles 33a (4 units in each of 2 rows for a total of 8 units in this embodiment), for individually suctioning and holding one each of electronic components 6. Each of suction nozzles 33a has its own heater 49 for heating the electronic component individually, as shown in FIG. 2. Electronic component 6 held on suction nozzle 33a is heated with the heat conducted through their contacting surface. Suction nozzles 33a function as holding tools for holding electronic components 6 individually. Mounting head 33 thus has a structure comprising the plurality of holding tools for individually holding electronic components 6, and electronic component heating devices for heating the plurality of electronic components 6 held on these holding tools.

Heaters 49 are kept in an operating mode at all the time while mounting heads 33 are in their transferring and mounting operation of electronic components 6, as will be described later, so that they heat electronic components 6 continuously while the electronic components 6 are in contact with suction nozzles 33a. In other words, the electronic component heating devices (i.e., heaters 49) are designed to heat electronic components 6 from a moment when suction nozzles 33a pick up electronic components 6 at electronic component feeder 200 until another moment when suction nozzles 33a release electronic components 6 after mounting them to substrate 13.

Mounting head 33 is equipped with a nozzle elevating mechanism and a nozzle rotating mechanism that make suction nozzles 33a individually movable vertically as well as rotatable horizontally around their axes (refer to FIG. 4). Mounting head 33 is also movable with the plurality of electronic components 6 held individually on suction nozzles 33a. When Y-axis motor 22 and X-axis motor 40 are operated, mounting head 33 moves horizontally in the X- and Y-directions, suctions and holds electronic components 6 with suction nozzles 33a at electronic component feeder 200, and mounts electronic components 6 being held thereon to their respective mounting positions on substrate 13.

The pair of Y-axis guides 21, center beam member 30, a Y-axis driving mechanism (comprised of Y-axis motor 22, feed screw 23a and nut member 23b) for moving center beam member 30 along Y-axis guides 21, and an X-axis driving mechanism (comprised of X-axis motor 40, feed screw 41a and nut member 41b) for moving mounting head 33 along X-axis guides 42 constitute a mounting head moving mechanism for moving mounting head 33 between two positions above electronic component feeder 200 and substrate retainer 10. The mounting head moving mechanism and mounting head 33 compose a mounting mechanism for moving mounting head 33 from electronic component feeder 200 to substrate retainer 10, and for mounting a plurality of electronic components 6 to substrate 13 by means of the plurality of holding tools 33a.

First beam member 31 is further equipped with substrate viewing camera 34. Bracket 34a which retains substrate viewing camera 34 has nut member 44b connected to it. Feed screw 44a engaged with nut member 44b is driven by X-axis motor 43. When driven by X-axis motor 43, substrate viewing camera 34 moves in the X-direction by being guided along X-axis guides 45 (refer to FIG. 2) provided on the side of first beam member 31. Substrate viewing camera 34 thus moves horizontally in both the X- and Y-directions when driven by Y-axis motor 24 and X-axis motor 43. Accordingly, substrate viewing camera 34 can be moved forward above substrate retainer 10 for taking an image of substrate 13 retained by substrate retainer 10, and for returning back from above the substrate retainer 10.

The pair of Y-axis guides 21, first beam member 31, a Y-axis driving mechanism (comprised of Y-axis motor 24, feed screw 25a and nut member 25b) for moving first beam member 31 along Y-axis guides 21, and an X-axis driving mechanism (comprised of X-axis motor 43, feed screw 44a and nut member 44b) for moving substrate viewing camera 34 along X-axis guides 45 constitute a substrate viewing camera moving mechanism for moving substrate viewing camera 34.

Second beam member 32 is equipped with wafer viewing camera 35. Bracket 35a which retains wafer viewing camera 35 has nut member 47b connected to it. Feed screw 47a engaged with nut member 47b is driven by X-axis motor 46. When driven by X-axis motor 46, wafer viewing camera 35 moves in the X-direction by being guided along X-axis guides 48 (refer to FIG. 2) provided on the side of second beam member 32. Wafer viewing camera 35 thus moves horizontally in both the X- and Y-directions when driven by Y-axis motor 26 and X-axis motor 46. Accordingly, wafer viewing camera 35 can be moved forward above electronic component feeder 200 for taking an image of electronic components 6 held on electronic component feeder 200, and for returning back from above the electronic component feeder 200.

The pair of Y-axis guides 21, second beam member 32, a Y-axis driving mechanism (comprised of Y-axis motor 26, feed screw 27a and nut member 27b) for moving second beam member 32 along Y-axis guides 21, and an X-axis driving mechanism (comprised of X-axis motor 46, feed screw 47a and nut member 47b) for moving wafer viewing camera 35 along X-axis guides 48 constitute a wafer viewing camera moving mechanism for moving wafer viewing camera 35.

Electronic component viewing camera 15 serving as an electronic component recognition unit is disposed in an area between electronic component feeder 200 and substrate retainer 10, where mounting head 33 is moved by the mounting head moving mechanism, as shown in FIG. 3. Electronic component viewing camera 15 is a linear type camera having linear optical detector 15b placed in the Y-direction as shown in FIG. 3. When mounting head 33 carrying electronic components 6 picked up at electronic component feeder 200 moves in the X-direction above electronic component viewing camera 15 while being lightened by illuminator 15a disposed on the upper surface, electronic component viewing camera 15 detects electronic components 6 held on suction nozzles 33a of mounting head 33 from below, and takes an image of electronic components 6.

Referring now to FIG. 4, description is provided next of a structure of a control system of the electronic component mounting apparatus. In FIG. 4, controller 50 controls ejector mechanism 80 (composed of ejector 8, ejector X-Y table 7 and pin elevating mechanism), nozzle elevating motor 33b for driving nozzle elevating mechanism in mounting head 33, driving motor 33c for the nozzle horizontally rotating mechanism, X-axis motor 40 for mounting head moving mechanisms 51, Y-axis motor 22, substrate viewing camera moving mechanism 52 and wafer viewing camera moving mechanism 53. That is, controller 50 controls mounting mechanism 400 comprising mounting head 33 and mounting head moving mechanism 51.

Electronic component recognition processor 54 detects a position of electronic components 6 as they are held by mounting head 33, by way of cognitive processing the viewed result (i.e., image) obtained by electronic component viewing camera 15. In other words, electronic component viewing camera 15 and electronic component recognition processor 54 function as an electronic component recognition unit for taking an image of the plurality of electronic components 6 held by the holding tools, and recognizing the position of these electronic components 6. Substrate recognition processor 55 detects a position of substrate 13 on substrate retainer 10 by way of cognitive processing the viewed result (image) obtained by substrate viewing camera 34. Wafer recognition processor 56 detects a position of electronic components 6 on electronic component feeder 200 by way of cognitive processing the viewed result (image) obtained by wafer viewing camera 35.

The results of recognition by electronic component recognition processor 54, substrate recognition processor 55 and wafer recognition processor 56 are delivered to controller 50. Controller 50 performs its controlling function based on these results of recognition in the process of component transferring and mounting operation described above. That is, controller 50 controls the mounting mechanism comprised of mounting head 33 and mounting head moving mechanism 51 according to the position data of electronic components 6 detected by wafer recognition processor 56, when picking up electronic components 6 from electronic component feeder 200. Controller 50 also controls the mounting mechanism according to the position data of electronic components 6 detected by electronic component recognition processor 54 as well as the position data of substrate 13 detected by substrate recognition processor 55, when mounting electronic components 6 to substrate 13.

Controller 50 here has the function of executing the individual operations to be carried out by the mounting mechanism according to the pre-established time allotment. Controller 50 controls the mounting mechanism and electronic component viewing camera 15 in a manner that a first heating time T1 becomes longer than a second heating time T2 as illustrated in the operation diagram of FIG. 7, and that electronic component viewing camera 15 takes an image of the plurality of electronic components 6 within the first heating time T1, as will be described later.

The electronic component mounting apparatus is constructed as above, and mounting head 33 performs the transferring and mounting operation of electronic components 6 in a manner which is described next by referring to the drawings. FIG. 5 is a timing chart showing an overall operation of transferring and mounting electronic components 6 as well as operations carried out by the individual suction nozzles 33a on mounting head 33. FIGS. 6A, 6B and 6C show operating modes of mounting head 33 in the electronic component holding step, the mounting head moving step and the electronic component mounting step. FIG. 7 and FIG. 8 show details of the operations for picking up the electronic components with the individual suction nozzles 33a and for transferring and mounting the components.

As shown in FIG. 5, the transferring and mounting operation comprises an electronic component holding step "A" for repeating a pick-up motion "P" to pick up electronic components 6 supplied by electronic component feeder 200 one after another in a successive manner with each of the plurality of suction nozzles 33a (i.e., the first nozzle to eighth nozzle), a mounting head transferring step "B" for moving mounting head 33, after the electronic component holding step "A", to a position above substrate retainer 10 retaining substrate 13, and an electronic component mounting step "C" for repeating a mounting motion "M", after the mounting head transferring step "B", to mount electronic components 6 to substrate 13 by vertically shifting the plurality of suction nozzles 33a (i.e., the first nozzle to eighth nozzle) one after another in a successive manner.

In the electronic component holding step "A", the plurality of suction nozzles 33a are moved to be in alignment with electronic components 6 affixed to adhesive sheet 5 in a successive manner, and make the individual suction nozzles 33a hold electronic components 6 one after another by having suction nozzles 33a carry out the pick-up motion "P" individually, as shown in FIG. 6A. Referring to FIG. 7, description is provided of the pick-up motion "P" during this process. First, suction nozzles 33a are moved to a position above electronic components 6 to be picked up, and one of suction nozzles 33a is lowered to bring it into contact with a top surface of one of electronic components 6.

Heater 49 has already been energized by this time so that heating of electronic component 6 begins at the moment when suction nozzle 33a comes into contact with it. Subsequently, suction nozzle 33a starts being raised at a low speed and then at a higher speed, to complete the pick up motion "P" for this suction nozzle 33a. After the completion of pick-up motion "P" for one suction nozzle 33a, another pick-up motion "P" is executed in the same manner for the next suction nozzle 33a, following a nozzle motion "Q" which includes a horizontal movement for making a positional alignment of the suction nozzle 33a to adjoining electronic component 6 and a rotational movement for making correction of "θ" orientation (i.e., orientational correction in the horizontal rotating angle). The same pick-up motion "P" and nozzle motion "Q" are then executed consecutively for the subsequent suction nozzles 33a.

In the mounting head transferring step "B", mounting head 33 moves horizontally from the position above component feeder 200 to substrate retainer 10, while holding electronic components 6 on all suction nozzles 33a as shown in FIG. 6B. Electronic components 6 are heated continuously during this step by heaters 49 through suction nozzles 33a. Mounting head 33 moves to a point left-side of electronic component viewing camera 15 (i.e., moving distance "D1" shown in FIG. 5) while holding electronic components 6 on all suction nozzles 33a, during this mounting head transferring step "B".

After mounting head 33 turns its moving direction here into X-direction, it moves linearly above electronic component viewing camera 15 in the direction of crossing linear optical detector 15b, as shown in FIG. 8 (i.e., moving distance "D2" shown in FIG. 5). Accordingly, electronic component viewing camera 15 takes an image of electronic components 6 held on suction nozzles 33a. Mounting head 33 then moves horizontally toward substrate retainer 10 (i.e., moving distance "D3" shown in FIG. 5).

In the electronic component mounting step "C", the plurality of suction nozzles 33a are aligned to component mounting locations on substrate 13 one by one in a successive manner, and make suction nozzles 33a mount electronic components 6 held on the individual suction nozzles 33a by having suction nozzles 33a carry out mounting motion "M" one after another, as shown in FIG. 6C. Substrate 13 has already been preheated by this time with substrate heater 500 built into substrate holder 10a so that the heat can further expedite thermal curing of adhesive layers 6b on electronic components 6. In other words, electronic components 6 are mounted to preheated substrate 13 in the electronic component mounting step.

Referring to FIG. 7, description is provided of the mounting motion "M" in the above process. First, one of suction nozzles 33a holding electronic components 6 is moved above a location on substrate 13 where the component is to be mounted, lowered, and landed with the holding electronic component 6 upon substrate 13, after having been slowed down its lowering speed. This suction nozzle 33a completes its mounting motion "M" when electronic component 6 is released and suction nozzle 33a raised upward. After the completion of mounting motion "M" for one suction nozzle 33a, another mounting motion "M" is carried out in the same manner for the next suction nozzle 33a, following a nozzle motion "N" which includes a horizontal movement for making a positional alignment of the suction nozzle 33a to adjoining electronic component 6 and a rotational movement for making correction of "θ" angle orientation. The same mounting motion "M" and nozzle motion "N" are then executed consecutively for the subsequent suction nozzles 33a.

Heaters 49 are in the operating mode during the component transferring and mounting operation discussed above. Electronic component heating step "E" is executed for each of suction nozzles 33a, in which electronic component 6 is heated from the moment when suction nozzle 33a comes into contact and holds electronic component 6 at electronic component feeder 200 until another moment when suction nozzle 33a releases electronic component 6 after mounting it to substrate 13 retained by substrate retainer 10, as shown in FIG. 7.

A heating time in this electronic component heating step "E" can be divided into a first heating time T1 of a duration from the moment when suction nozzle 33a comes into contact to hold electronic component 6 till immediately before it begins the mounting motion "M", and a second heating time T2 of a duration from the moment when suction nozzle 33a begins the mounting motion "M" till another moment when it leaves electronic component 6 mounted to substrate 13.

In the electronic component transferring and mounting operation discussed in this exemplary embodiment, the mounting mechanism is controlled by controller 50 in a manner that the first heating time T1 becomes longer than the second heating time T2. The process of taking the image and recognition of the electronic component is carried out by electronic component viewing camera 15 during this first heating time T1.

Since operation of the mounting mechanism is controlled according to the above condition of time allotment, this embodiment allows a sufficient heating time to heat electronic components 6 before the individual suction nozzles 33a begin their mounting motions "M". Suction nozzles 33a are therefore not required to stay standing at the lower position to heat electronic components 6 during the mounting motions "M". When adopted, this invention can reduce the time required for the mounting operation to 0.2 second or less. As a result, the invention can substantially shorten a cycle time of the overall operation in the electronic component mounting work as compared to the conventional method of heating electronic components 6 while pressing them against the substrate. It therefore improves efficiency of the electronic component mounting operation and realizes high productivity in the component mounting step.

The invention also limits to very short a time in which a shaft of suction nozzle 33a is heated by the heat radiated from heaters 49 of the adjoining suction nozzles 33a, since suction nozzle 33a stays standing only for a short period of time in the lower position duration the mounting motion shown in FIG. 6C. The invention can thus avoid a problem attributable to thermal expansion and contraction of various parts of the mechanism in mounting head 33 due to rises in temperature by the heat conducted to the mechanism from suction nozzles 33a.

Second Exemplary Embodiment

Figure 9A:
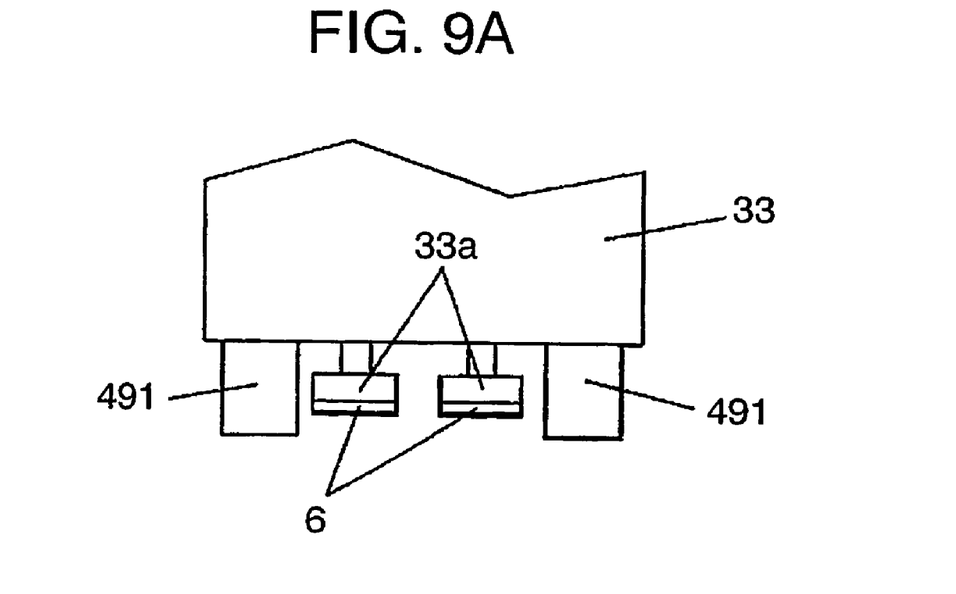
FIG. 9A and FIG. 9B are diagrammatic drawings illustrating explanatorily a component transferring and mounting operation of an electronic component mounting apparatus according to a second exemplary embodiment of this invention.
Figure 9B:
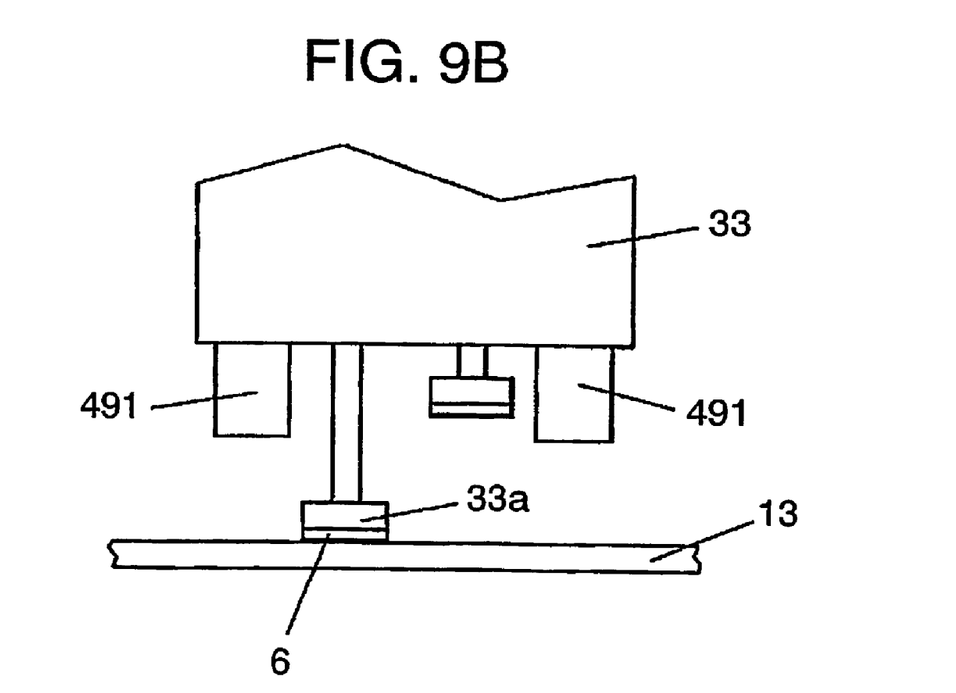

In the first exemplary embodiment described above, although the electronic component heating step is executed with heaters 49 provided individually in suction nozzles 33a, a structure shown in FIG. 9A and FIG. 9B may be used alternatively. FIG. 9A and FIG. 9B are diagrammatic drawings explanatorily illustrating a component transferring and mounting operation by an electronic component mounting apparatus according to the second exemplary embodiment.

The second exemplary embodiment differs from the above-discussed first exemplary embodiment in the following respect. That is, in this second exemplary embodiment, heaters 491 comprising non-contact type heating devices are disposed in a manner to surround a plurality of suction nozzles 33a on the underside surface of mounting head 33 to heat the plurality of suction nozzles 33a without being in contact thereto by means of the radiant heat of heaters 491. In the second exemplary embodiment, like advantageous effects are also anticipated as those of the first exemplary embodiment described above.

INDUSTRIAL APPLICABILITY

An electronic component mounting apparatus of the present invention has advantages of improving efficiency in the mounting operation of electronic components and realizing high productivity of the component mounting step, and it is especially useful for mounting low-profile electronic components to a substrate.

The invention claimed is:

1. An electronic component mounting apparatus for mounting electronic components to a substrate while heating the electronic components, each of the electronic components having an adhesive layer on a surface to be bonded to the substrate, the apparatus comprising:
    an electronic component feeder for feeding the electronic components;
    a substrate retainer for retaining the substrate;
    a mounting head provided with a plurality of holding tools for individually holding the electronic components, and electronic component heating devices for heating the plurality of electronic components held by the holding tools;
    a mounting mechanism for transferring the mounting head from the electronic component feeder to the substrate retainer, and mounting the plurality of electronic components to the substrate by using the plurality of holding tools; and
    a controller for controlling the mounting mechanism,
    wherein the electronic component heating devices heat the electronic components from a moment when the holding tools pick up the electronic components at the electronic component feeder until another moment when the holding tools release the electronic components after mounting them to the substrate, and
    the controller controls the mounting mechanism in a manner that a first heating time of a duration from the moment when the holding tool comes into contact with the electronic component for picking it up till another moment immediately before the holding tool begins a mounting motion to the substrate is longer than a second heating time of a duration from the moment when the holding tool begins the mounting motion till another moment when the holding tool leaves the electronic component mounted to the substrate.

2. The electronic component mounting apparatus according to claim 1, wherein the electronic component heating devices comprise heaters disposed individually to the holding tools.

3. The electronic component mounting apparatus according to claim 1, wherein the electronic component heating devices comprise non-contact type heating devices for heating the plurality of holding tools without being in contact thereto.

4. The electronic component mounting apparatus according to claim 1, wherein the substrate retainer is provided further with a substrate heater for heating the substrate.

5. The electronic component mounting apparatus according to claim 1 further comprising an electronic component recognition unit for taking an image of the plurality of electronic components held by the holding tools and for recognizing a position of the electronic components, wherein the electronic component recognition unit takes the image of the plurality of electronic components within the duration of the first heating time.

6. An electronic component mounting method for mounting electronic components to a substrate while heating the electronic components, each of the electronic components having an adhesive layer on a surface to be bonded to the substrate, the method comprising:
    an electronic component holding step for repeating a pick-up motion to pick up the electronic components supplied by an electronic component feeder one after another in a successive manner with each of a plurality of holding tools provided on a mounting head;
    a mounting head transferring step for moving the mounting head, after the electronic component holding step, to a position above a substrate retainer retaining the substrate;
    an electronic component mounting step for repeating a mounting motion, after the mounting head transferring step, to mount the electronic components to the substrate by vertically shifting the plurality of holding tools one after another in a successive manner; and
    an electronic component heating step for heating the electronic components from a moment when the holding tools come into contact with and pick up the electronic components at the electronic component feeder until another moment when the holding tools release and leave the electronic components after mounting them to the substrate retained on the substrate retainer,
    wherein the electronic component heating step comprises a first heating time of a duration from the moment when the holding tool comes into contact with the electronic component for picking it up till another moment immediately before the holding tool begins a mounting motion to the substrate, and a second heating time of a duration from the moment when the holding tool begins the mounting motion till another moment when the holding tool leaves the electronic component mounted to the substrate, and the first heating time is set longer than the second heating time.

7. The electronic component mounting method according to claim 6, wherein the electronic component heating step is carried out by heaters disposed individually to the holding tools.

8. The electronic component mounting method according to claim 6, wherein the electronic component heating step is carried out by non-contact type heating devices for heating the plurality of holding tools without being in contact thereto.

9. The electronic component mounting method according to claim 6, wherein the electronic components are mounted in the electronic component mounting step onto the substrate heated beforehand.

10. The electronic component mounting method according to claim 6 further comprising an electronic component recognizing step for taking an image of the plurality of electronic components held by the holding tools and for recognizing a position of the electronic components with an electronic component recognition unit, wherein the image of the plurality of electronic components is taken by the electronic component recognition unit within the duration of the first heating time.

* * * * *